(12) United States Patent
Robinson et al.

(10) Patent No.: US 7,043,213 B2
(45) Date of Patent: May 9, 2006

(54) MULTI-MODE AMPLIFIER SYSTEM

(75) Inventors: Ian Robinson, Venice, CA (US); Frank Winter, San Diego, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 271 days.

(21) Appl. No.: 10/603,880

(22) Filed: Jun. 24, 2003

(65) Prior Publication Data

US 2004/0266366 A1    Dec. 30, 2004

(51) Int. Cl.
H03F 3/38 (2006.01)

(52) U.S. Cl. .............................. 455/127.2; 455/127.4; 330/10

(58) Field of Classification Search ............. 455/127.1, 455/127.2, 127.4; 330/136, 10, 297
See application file for complete search history.

(56) References Cited

U.S. PATENT DOCUMENTS

| | | | |
|---|---|---|---|
| 6,043,707 A * | 3/2000 | Budnik ........................ 330/10 |
| 6,101,224 A * | 8/2000 | Lindoff et al. ............... 375/300 |
| 6,141,541 A | 10/2000 | Midya et al. |
| 6,236,237 B1 * | 5/2001 | Wong et al. .................... 326/83 |
| 6,349,216 B1 | 2/2002 | Alberth, Jr. et al. |
| 6,407,634 B1 | 6/2002 | Staudinger et al. |
| 6,445,247 B1 | 9/2002 | Walker |
| 6,449,465 B1 * | 9/2002 | Gailus et al. ................ 455/126 |
| 6,681,101 B1 * | 1/2004 | Eidson et al. ............ 455/127.1 |
| 6,873,211 B1 | 3/2005 | Thompson et al. |
| 6,892,057 B1 * | 5/2005 | Nilsson ....................... 455/126 |
| 2004/0071225 A1 | 4/2004 | Suzuki et al. |

OTHER PUBLICATIONS

European Search Report for EP 03 025 796.8, completed Aug. 6, 2004.
G. Hanington, et al., "High-Efficiency Power Amplifier Using Dynamic Power-Supply Voltage for CDMA Applications", IEEE Transactions on Microwave Theory and Techniques, vol. 47, No. 8, Aug. 1999, pp. 1471-1476.
New U.S. Winter, et al. patent application entitled "Polar and Linear Amplifier System", Filed Jun. 24, 2003.
New U.S. Robinson, et al. patent application entitled "Multi-Mode Multi-Amplifier Architecture", filed Jun. 24, 2003.

* cited by examiner

Primary Examiner—Edward F. Urban
Assistant Examiner—Adeel Haroon
(74) Attorney, Agent, or Firm—Tarolli, Sundheim, Covell & Tummino L.L.P.

(57) ABSTRACT

An amplifier system is provided that switches between a linear mode of operation, an envelope tracking mode of operation and a polar mode of operation. The amplifier system switches between modes of operation based upon a characteristic of an input signal relative to a first threshold level and a second threshold level. A mode selector selects the operation mode by transmitting an amplitude modulated signal plus a variable headroom voltage to a supply terminal of a power amplifier during the envelope tracking mode, an amplitude modulated signal to the supply terminal and phase modulated input signal during the polar mode and a substantially constant amplitude signal to the supply terminal during the linear mode.

28 Claims, 7 Drawing Sheets

MULTI-MODE AMPLIFIER SYSTEM

TECHNICAL FIELD

The present invention relates generally to electronic devices, and more particularly to a multi-mode amplifier system.

BACKGROUND OF THE INVENTION

RF power amplifiers used for wireless communication transmitters, with spectrally efficient modulation formats, require high linearity to preserve modulation accuracy and to limit spectral regrowth. Typically, a linear amplifier, Class-A type, Class-AB type or Class-B is employed to faithfully reproduce inputs signals and to limit the amplifier output within a strict emissions mask. Linear amplifiers are capable of electrical (DC power in to RF power out or DC-RF) efficiencies greater than 50% when operated at saturation. However, they are generally not operated at high efficiency due to the need to provide high linearity. For constant envelope waveforms, linear amplifiers are often operated below saturation to provide for operation in their linear regime. Time varying envelopes present an additional challenge. The general solution is to amplify the peaks of the waveform near saturation, resulting in the average power of the waveform being amplified at a level well backed-off from saturation. The back-off level, also referred to as output power back-off (OPBO), determines the electrical efficiency of a linear amplifier.

For example, the efficiency of a Class-A type amplifier decreases with output power relative to its peak value ($EFF=P_{OUT}/P_{PEAK}$). The efficiency of Class-B type amplifiers also decreases with output power relative to its peak value ($EFF=P_{OUT}/P_{PEAK})^{1/2}$). Class-AB type amplifiers have output power variations intermediate between these values. Thus, there is customarily an inherent tradeoff between linearity and efficiency in amplifier designs.

Modern transmitters for applications such as cellular, personal, and satellite communications employ digital modulation techniques such as quadrature phase-shift keying (QPSK) in combination with code division multiple access (CDMA) communication. Shaping of the data pulses mitigates out-of-band emissions from occurring into adjacent channels but produces time-varying envelopes. In addition to amplifying individual waveforms with time varying envelopes, many transmitters (especially in base stations) are being configured to amplify multiple carriers. Multi-carrier signals have high a wide distribution of power levels resulting in a large peak-to-average ratio (PAR). Therefore, the operation of the linear amplifiers in these types of signals is very inefficient, since the amplifiers need to have their supply voltage sized to handle the large peak voltages even though the signals are much smaller a substantial portion of the time. Additionally, the size and cost of the power amplifier is generally proportional to the required peak output power of the amplifier.

Wideband Code Division Multiple Access (WCDMA), Orthogonal Frequency Division Multiplexing (OFDM), and multi-carrier versions of Global Standard for Mobile Communication (GSM) and Code Division Multiple Access 2000 (CDMA 2000) are wireless standards and application growing in use. Each requires amplification of a waveform with high PAR levels, above 10 dB in some cases. The sparse amount of spectrum allocated to terrestrial wireless communication requires that transmissions minimize out-of-band (OOB) emissions to minimize the interference environment. A linear amplifier used to amplify a waveform with a PAR of 10 dB or more provides only 5–10% DC-RF efficiency. The peak output power for the amplifier is sized by the peak waveform. The cost of the amplifier scales with its, peak power. Several other circuit costs including heat sinks and DC-DC power supplies scale inversely to peak power and dissipated heat (which results from the electrical inefficiency). Related base station costs of AC-DC power supplies, back-up batteries, cooling, and circuit breakers also scale inversely with efficiency as does the electrical operating costs. Clearly, improving DC-RF efficiency is a major cost saver both for manufacture and operation.

One efficiency enhancement technique for linear amplifiers is known as envelope tracking or envelope following. In an envelope following or envelope tracking, the supply voltage to a linear power amplifier is reduced or increased in response to the amplitude of the amplitude modulated envelope. The supply voltage applied to the power amplifier follows the amplitude modulated envelope of the input signal provided to the power amplifier. The supply voltage is maintained at levels that assure amplifier operation out of saturation. For example, when the envelope amplitude is at peak, the supply voltage is at a signal level above the peak voltage, and when the envelope amplitude is at its minimum, the supply voltage decreases below the peak voltages, thus providing a more efficient amplifier than constant supply linear amplifiers. However, the envelope following typically requires a significant output power back-off (OPBO) level or headroom compared to peak signal levels to achieve high linearity (e.g., ensuring the peak of the input signal is not distorted by amplifier gain compression). This requires much larger, more costly amplifiers to provide the necessary back-off and thus lower efficiency. Additionally, if the signal varies over a large dynamic range it may cause the envelope tracking amplifier to operate with very low drain voltages resulting in additional signal distortion and eventually causes the amplifier system to shutoff.

A second efficiency enhancement is known as the Kahn or Envelope Elimination and Restoration (EER) technique. The EER technique detects the envelope of the incoming signal to produce a baseband amplitude modulated (AM) signal. The EER technique limits the input signal to produce a constant envelope phase modulated (PM) component. The PM signal is provided to the input of the power amplifier along a PM path (typically applied to the Gate or Base of a transistor) and the amplitude modulated component is employed to modulate the supply of the power amplifier (typically at the Drain or Collector) along an AM path. Amplitude modulation of the final RF power amplifier restores the envelope to the phase-modulated carrier, creating an amplified version of the original modulated input signal. Since the signal input to the power amplifier has a generally constant envelope amplitude, a more efficient class of power amplifier (e.g., Class-C type amplifiers) can be employed to amplify the input signal. Additionally, since the supply signal is amplitude modulated, the amplifier is operating at compression enhancing the overall efficiency of the amplifier. Amplifiers using EER are known as Polar Amplifiers.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor delineate the scope of the invention. Its sole purpose is to present some concepts of the invention in a simplified form as a prelude to the more detailed description that is presented later.

The present invention relates to an amplifier system that switches modes of operation between an envelope tracking mode, a polar mode and a linear mode based on a characteristic of an input signal (e.g., envelope amplitude threshold levels, digital count representation of signal levels, power amplifier power levels or the like).

In the envelope tracking mode, a composite input signal component is transmitted to the input terminal of a power amplifier and a variable amplitude supply: signal is transmitted to the supply terminal of the power amplifier. The variable amplitude supply signal is not necessarily an information bearing signal and only needs to maintain a desired headroom over the modulated amplitude of the input signal. In the polar mode, the input signal is converted into two components whose product is proportional to the input signal. A substantially constant envelope, phase modulated component of the input signal is transmitted to the input terminal of the power amplifier, and an amplitude modulated component of the input signal is transmitted to the supply terminal of the power amplifier. In the linear mode, a composite signal component is transmitted to the input terminal and a substantially constant amplitude signal is transmitted to the supply terminal. The combination of these modes can be used to optimize amplifier size/cost, efficiency, signal distortion, and/or OOB emissions.

In one aspect of the invention, a digital component, such as a mode selector determines the amplifier system mode operation by transmitting selected amplifier input terminal signals and amplifier supply terminal signals. The mode selector can comprise a digital hardware device such as programmable logic device, field programmable gate array, discrete logic devices, or an algorithm executed on a digital signal processor (DSP), a controller, a microprocessor or the like. The mode selector can comprise a variety of different hardware and/or software components. The input signals are converted from the digital domain to the analog domain via respective digital-to-analog converters (DACs). DACs can be employed in the amplifier system to convert the input signals from the digital domain to the analog domain directly to radio transmission frequencies. The radio transmission frequencies can be in radio frequency (RF) ranges (e.g., kilohertz range, megahertz range) or in microwave frequency ranges (e.g., gigahertz range). In another aspect of the invention, at least one of the DACs is a delta sigma modulator DAC.

In yet another aspect of the present invention, the input signal can be modified via predistortion techniques to facilitate linearization of the amplifier system and to mitigate out-of-band emissions. Separate predistortion is applied to the amplifier input terminal signals and amplifier supply terminal signals. Alternatively, the output signal can be modified by a digital cross-cancellation technique that employs a clean reference signal to compute and correct distortion in the output signal. The digital cross-cancellation technique allows for modification of the input signal to improve amplifier performance that can be corrected at the output of the power amplifier. The predistortion technique and digital cross-cancellation technique can be combined to facilitate linearization and to mitigate out-of-band emissions of the amplifier system.

To the accomplishment of the foregoing and related ends, certain illustrative aspects of the invention are described herein in connection with the following description and the annexed drawings. These aspects are indicative, however, of but a few of the various ways in which the principles of the invention may be employed and the present invention is intended to include all such aspects and their equivalents. Other advantages and novel features of the invention will become apparent from the following detailed description of the invention when considered in conjunction with the drawings.

DETAILED DESCRIPTION OF INVENTION

The present invention relates to an amplifier system that switches between operation in a linear mode, an envelope tracking mode and a polar mode. The amplifier system switches between operations based on a characteristic of an input signal relative to a first threshold level and a second threshold level (e.g., envelope amplitude levels, digital count representation of signal levels, power amplifier power levels). The amplifier system can employ a power amplifier that maintains a constant class configuration. However, a power amplifier that maintains a constant class configuration is not required.

In one aspect of the invention, the amplifier system operates as an envelope tracking amplifier for signals (e.g., input signals, amplifier output signals) between low amplitude levels and highest amplitude levels. The amplifier system operates as a linear amplifier system (e.g., Class A, A/B, or B,) for low amplitude level signals and as a polar amplifier for peak amplitude level signals. The amplifier class configuration of the power amplifier can remain constant in all modes. Low level signals are signals associated with amplifier supply levels (at or near) the level that would cause the power amplifier to shutdown or cause unacceptable distortion when operating in an envelope tracking mode. Peak level signals are signals associated with supply levels (at or near) that would exceed peak levels of the power amplifier output signals when operating in an envelope tracking mode.

A mode selector controls the signal amplitude level that is transmitted to the supply input of the power amplifier and concurrently controls the signal that is transmitted to the input terminal of the power amplifier. In the linear mode, a supply voltage having a substantially constant amplitude level is provided to the power amplifier. In the envelope tracking mode, a variable amplitude supply signal that maintains a headroom amplitude above the input signal level, ensuring the input signal is not distorted by gain compression, is provided to the power amplifier. In both the linear mode and the envelope tracking mode, a composite input signal is provided to the input of the power amplifier. In the polar mode, polar components of the signal are sent to the power amplifier with an amplitude modulated signal supplying the power amplifier and a phase modulated input signal having a substantially constant amplitude being provided to the input of the power amplifier.

In conventional polar amplifiers, the bandwidth of the AM path is greater than or equal to the input signal bandwidth. In conventional ET amplifiers, the bandwidth of the supply signal is typically at least comparable to the input signal. In the present invention, proper selection of the voltage levels at which mode switches occur enables the bandwidth of the common AM or supply path to be minimized.

Figure 1:
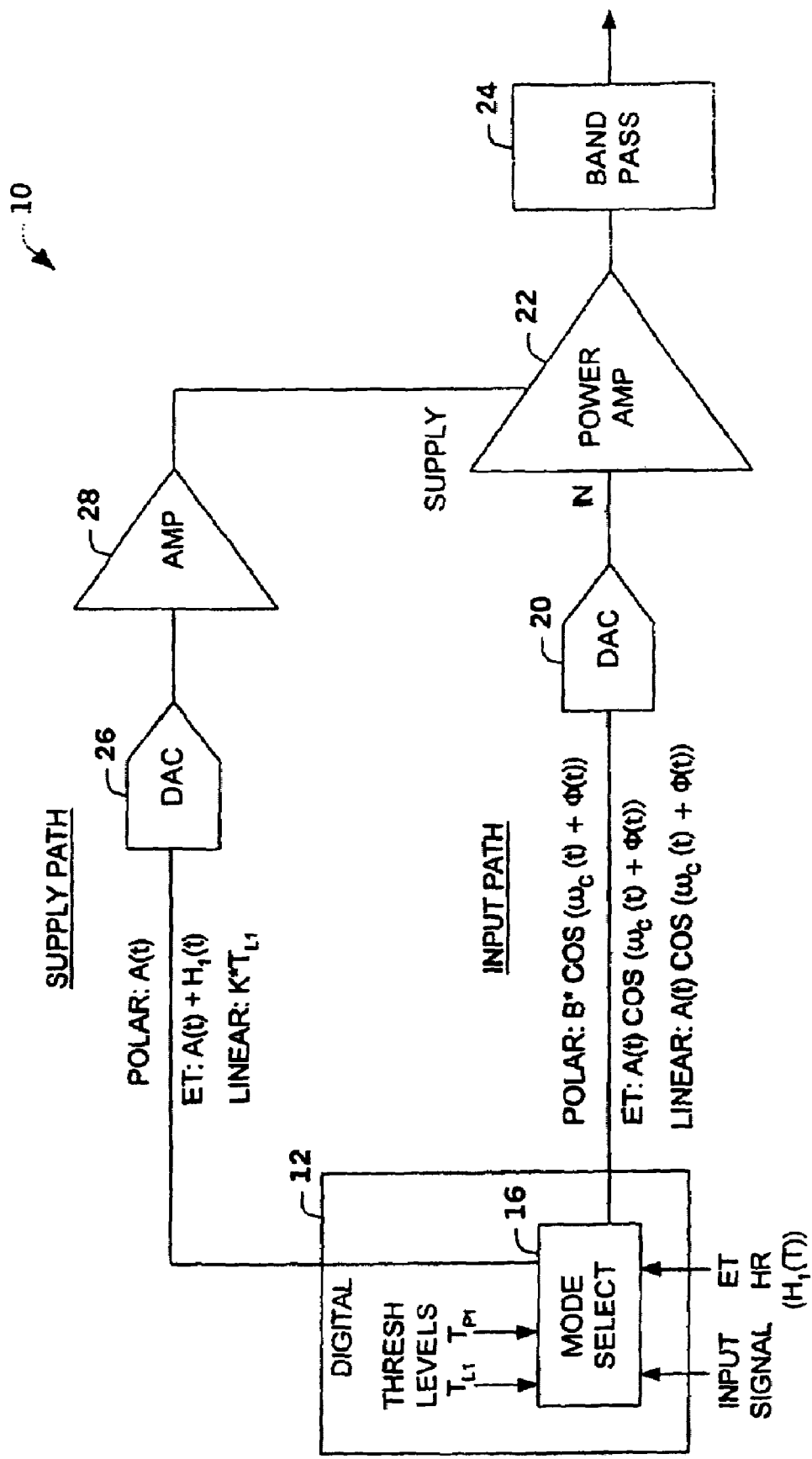
FIG. 1 illustrates a schematic block diagram of an amplifier system in accordance with an aspect of the present invention.

FIG. 1 illustrates an amplifier system 10 in accordance with an aspect of the present invention. The amplifier system 10 switches operation between an envelope tracking mode, a linear mode and a polar mode based on one or more characteristics of an input signal relative to a first threshold level and a second threshold level (e.g., envelope amplitude levels, digital count representation of signal levels, power amplifier power levels). For example, the first and second threshold levels can be selected envelope amplitude levels or digital counts corresponding to the envelope amplitude levels of the input signal. The amplifier system 10 operates as an envelope tracking amplifier for a substantial portion of the signal levels. However, for low signal levels, the amplifier system transitions to a linear mode to mitigate problems associated with amplifier low drain or supply voltages. For peak level signals, the amplifier system transitions to a polar mode allowing operation at saturation and removing the need to provide "headroom" associated with envelope tracking amplifiers. Therefore, the supply voltage to the power amplifier 22 does not need to exceed the peak voltage of the amplifier output signal. As a result, a smaller power amplifier can be employed as compared to a conventional ET amplifier.

It is to be appreciated that the threshold levels of the amplifier system can be one or more characteristics associated with the input signal based on a desired efficiency, linearity, distortion and acceptable OOB emissions of the amplifier system 10. Additionally, the threshold levels can be affected by one or more characteristics associated with amplifier system fabrication technology (e.g., Gallium Arsenide (GaAs), Indium Phosphide (InP), Gallium Nitride (GaN), Silicon (Si), Laterally Diffused Metal Oxide Semiconductors (LDMOS)). Many exemplary embodiments of the present invention will be described with respect to the threshold levels being selected envelope amplitude levels for illustrative purposes. Additionally, other characteristics associated with the input signal, the output signal, the power associated with the power amplifier and/or the fabrication technology can influence the control of the switching of the amplifier system 10 between an envelope tracking mode, a linear mode, and a polar mode of operation.

The amplifier system 10 includes a digital component 12, such as a programmable logic device, a digital signal processor (DSP) or a combination of digital hardware and/or software components. The digital component 12 includes a mode selector 16 that tracks the input signal and provides the desired supply signals to a power amplifier 22. The mode selector 16 also provides polar components of the input signal in the polar mode. The mode selector 16 switches the amplifier between an envelope tracking mode, a linear mode and a polar mode. The mode selector 16 receives a composite signal component that is a polar representation of an input signal. The input signal is typically a phase and amplitude modulated signal which can be represented in polar form by the following equation:

$$A(t)\text{COS}(\omega_c(t)+\phi(t))$$

where $A(t)$ is the amplitude modulated component and $\text{COS}(\omega_c(t)+\phi(t))$ is the phase modulated component, $\phi(t)$ is the phase component and $\omega_c(t)$ is the carrier frequency. The input signal can be in a variety of different amplitude and/or phase modulated forms. It is to be appreciated that the above equation illustrates a polar representation of a single carrier input signal, where the actual signal can be a multi-carrier signal. In a multi-carrier case the equation is valid however $\omega_c$ represents a virtual carrier frequency which is a weighted average of the carriers present.

For example, the signal can be a signal that conforms to WCDMA, multi-carrier GSM, OFDM or other signals having similar signatures with high peak-to-average ratios (PAR). The input signal can be provided to a polar converter (not shown) that transforms the input signal into a polar composite signal. Alternatively, the input signal can be provided in polar form directly to the mode selector 16. The mode selector 16 can be operative to separate the composite signal into a separate phase modulated component $\text{COS}(\omega_c(t)+\phi(t))$ and an amplitude modulated component $A(t)$ for polar operations.

The mode selector 16 receives a first threshold level $T_{L1}$ and a second threshold level $T_{P1}$ that can be one or more fixed, selectable or programmable characteristics (e.g., envelope amplitude levels) associated with the input signal. For example, if the first threshold level $T_{L1}$ and the second threshold level $T^{P1}$ are associated with envelope amplitude levels of the input signal, the amplifier system 10 will operate in a linear mode for input signal amplitude levels at or below about the first threshold level $T_{L1}$ (e.g., low level signals). The amplifier system 10 operates in an envelope tracking mode for input signal amplitude levels at or between about the first threshold level $T_{L1}$ and about the second threshold level $T_{P1}$, and in a polar mode for input signal amplitude levels between at or about the second threshold level $T_{P1}$ (e.g., peak level signals). The mode selector 16 also receives an envelope tracking (ET) headroom amplitude level ($H_1$) that is employed to provide linear operation of the amplifier with high efficiency in the envelope tracking mode. The headroom signal can vary with time or input signal level.

The amplifier system 10 includes a main power amplifier 22 that includes an input terminal (IN) and a supply terminal (SUPPLY). The mode selector 16 has a first output coupled to the input terminal of the power amplifier 22 through a first digital-to-analog converter (DAC) 20 along an input path. The mode selector 16 has a second output coupled to a modulation amplifier 28 through a second DAC 26 along a supply path. The output of the modulation amplifier 28 is coupled to the supply terminal of the main power amplifier 22. The modulation amplifier 28 is typically an efficient Class-S type or Class-G type modulator but is not limited to these classes. The modulation amplifier 28 should be relatively efficient since overall efficiency is proportional to its efficiency.

It is to be appreciated that the modulation amplifier 28 can be a pulse width modulator, a switching amplifier or a linear amplifier based on desirable bandwidth and acceptable distortion limits. Low distortion is required because in polar mode the AM path carries an information bearing signal. The bandwidth and peak-to-peak voltage swing required are a function of mode switch levels, where the higher the voltage level at which polar mode begins the lower the required bandwidth and voltage swing for the AM path amplifier. Operating in polar mode for just the highest level input signals means this mode is used a few percent of the time or less. The bandwidth required for this mode is small compared to a conventional polar amplifier. The OOB that occur in this mode are a small component of the overall emissions.

The power amplifier 22 is typically a linear amplifier (e.g., Class-A, Class-AB, Class-B) since the input to the linear amplifier in the linear mode and the envelope tracking mode is an amplitude and/or phase modulated signal. It is also to be appreciated that the power amplifier 22 can be other more efficient types of amplifiers based on desirable bandwidth and acceptable distortion limits. However, the employment of a linear amplifier provides a more desirable linear and cost effective solution.

In the linear mode, the mode selector transmits a composite signal component $A(t)\cos(\omega_c(t)+\phi(t))$ of the input signal in digital form to the first DAC 20. The first DAC 20 converts the composite signal component into the analog domain, which is provided to the input terminal of the main power amplifier 22. The mode selector 16 concurrently transmits a signal of constant amplitude (e.g., $K*T_{L1}$) in digital form to the second DAC 26, where $T_{L1}$ is the first threshold level and K is a constant greater than or equal to one. The second DAC 26 converts the constant amplitude signal from the digital domain to the analog domain and provides the amplified version of the constant amplitude signal to the modulation amplifier 28. The modulation amplifier 28 provides an amplified version of the constant amplitude to the supply terminal of the power amplifier 22. The output of the power amplifier 22 is a reconstructed amplified version of the composite signal. The composite signal is then provided to an optional band pass filter 24 which filters out any remaining unwanted signals outside the desired transmission band.

In the envelope tracking mode, the mode selector 16 transmits the composite signal component $A(t)\cos(\omega_c(t)+\phi(t))$ in digital form to the first DAC 20. The first DAC 20 converts the composite signal component into the analog domain, which is provided to the input terminal of the main power amplifier 22. The mode selector 16 concurrently transmits an envelope tracking supply signal that is equal to the envelope amplitude signal plus the headroom amplitude $(A(t)+H_1(t))$, which maintains operation of the power amplifier 22 in its linear region (the headroom signal can be varied over time to optimize efficiency and OOB emissions). The mode selector 16 can employ a "look ahead" algorithm to determine the selection of the headroom amplitude to facilitate efficiency. The second DAC 26 converts the envelope tracking supply signal from the digital domain to the analog domain and provides the analog version of the envelope tracking supply signal to the modulation amplifier 28. The modulation amplifier 28 provides an amplified analog version of the envelope tracking supply signal to the supply terminal of the power amplifier 22. The composite signal is then provided to the optional band pass filter 24 which filters out any remaining unwanted signals outside the desired transmission band.

In the polar mode, the mode selector 16 transmits the phase modulated component $B*\cos(\omega_c(t)+\phi(t))$ of the composite signal in digital form to the first DAC 20, where B is a constant. The phase modulated component has a constant envelope waveform. The first DAC 20 converts the phase modulated component of the composite signal into the analog domain, which is provided to the input terminal of the main power amplifier 22. The mode selector 16 concurrently transmits the amplitude modulated component $A(t)$ of the composite signal in digital form to the second DAC 26. The second DAC 26 converts the amplitude modulated component $A(t)$ from the digital domain to the analog domain. The analog amplitude modulated component is then provided to the modulation amplifier 28 which amplitude modulates the supply terminal of the power amplifier 22. The output of the power amplifier 22 is a reconstructed amplified version of the composite signal. The amplified composite signal is then provided to the optional band pass filter 24 which filters out any remaining unwanted signals outside the desired transmission band.

In one aspect of the invention, one or both of the first DAC 20 and the second DAC 26 are delta sigma modulated DACs. Delta Sigma modulation is a technique used to generate a coarse estimate of a signal using a small number of quantization levels and a very high sampling rate. The small number (two for a one-bit quantizer) of quantization levels introduces "quantization" noise into the system. The effect of oversampling and the use of an integrator feedback-loop in delta-sigma modulation are effective in shifting noise to out-of-band frequencies. The noise shifting properties and introduction of quantization error enables efficient use of subsequent filtering stages to remove noise and produce a more precise representation of the input at a much higher frequency. The delta sigma DACs can be employed to upmix the input signal directly to radio transmission frequencies, such that further upmixing of the signals via conventional analog mixers is not required. The radio transmission frequencies can be in radio frequency (RF) ranges (e.g., megahertz range) or in microwave frequency ranges (e.g., gigahertz range).

Figure 2:
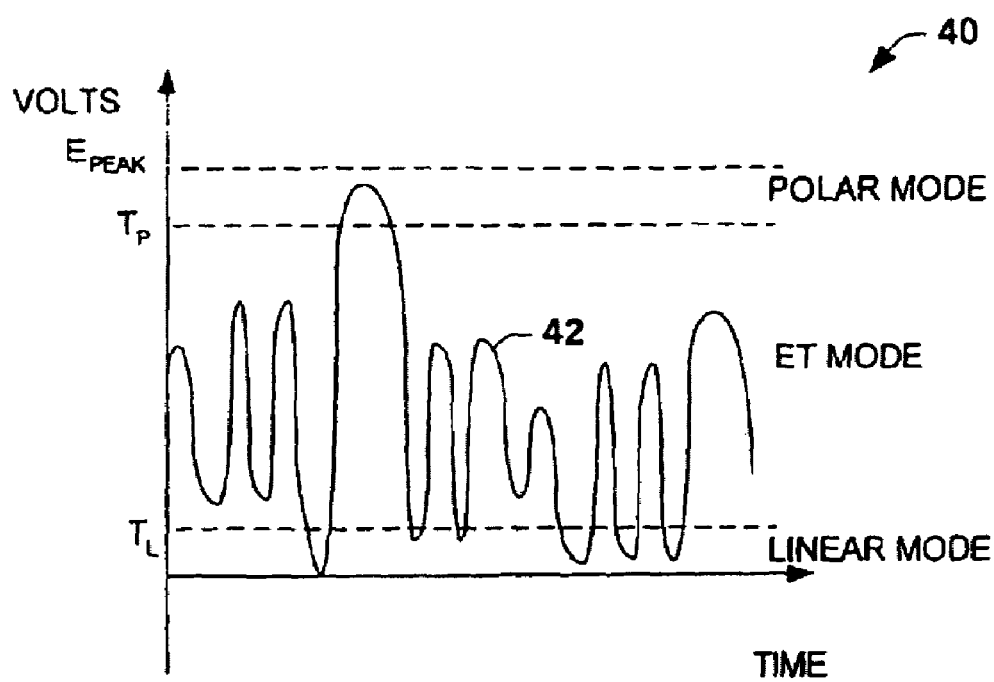
FIG. 2 illustrates a graph of voltage versus time of an exemplary input signal.

It is to be appreciated that the threshold levels can be selected to achieve a desired efficiency, linearity and power amplifier size. FIG. 2 illustrates a graph 40 of voltage versus time of an exemplary composite input signal 42. The first threshold level $T_L$ and the second threshold level $T_P$ are selected to be envelope amplitude threshold levels. In one aspect of the present invention, the amplifier system operates in the linear mode for input amplitude signal levels at or below the first threshold level $T_L$, the envelope tracking mode for input amplitude signal levels between the threshold levels $T_L$ and $T_P$ and the polar mode for amplitude signal levels at or above the second threshold level $T_P$.

The first and second threshold levels $T_L$ and $T_P$ are selected so that the amplifier operates in the envelope tracking mode a substantial portion of the time. However, for peak signal levels, the amplifier transitions to a polar mode of operation so that the amplifier operates at saturation. Therefore, a smaller less costly power amplifier can be employed than with conventional envelope tracking amplifiers that require a supply voltage above the output peak voltage level to assure appropriate headroom. The amplifier system operates in the linear mode for lower amplitude signals so that distortion and amplifier shutdown due to low supply signals is averted.

Figure 3:
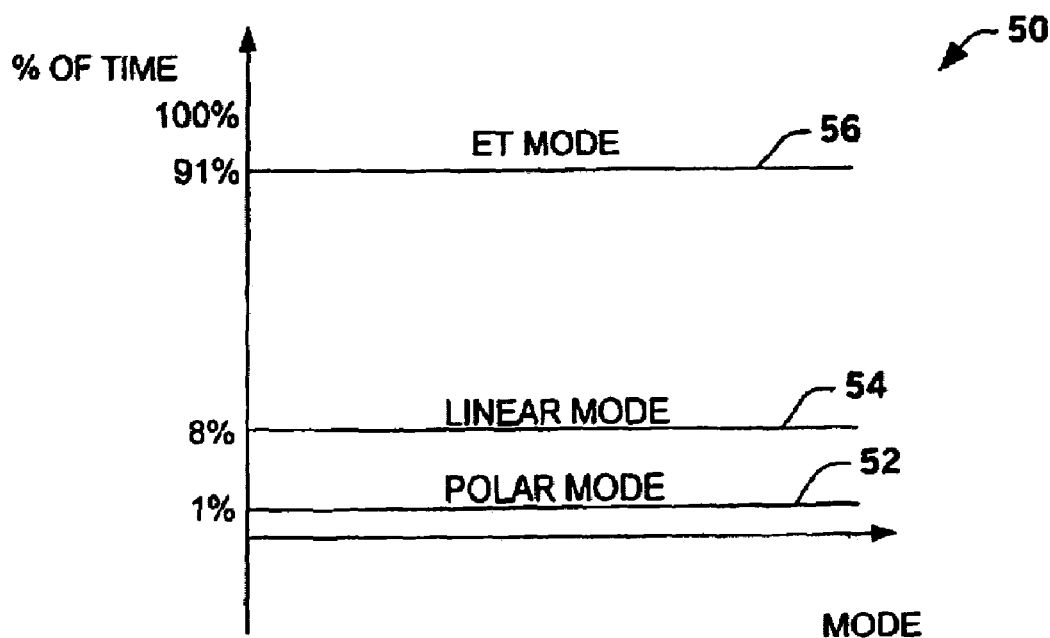
FIG. 3 illustrates a graph of percentage of time versus mode of an exemplary power amplifier system in accordance with an aspect of the present invention.

FIG. 3 illustrates a graph 50 of percentage of time versus mode of an exemplary power amplifier system in accordance with an aspect of the present invention. In the exemplary power amplifier system, the polar mode is represented by a line 52 associated with the amplifier system being in the polar mode 1% of the time. The linear mode is represented by a line 54 associated with the amplifier system being in the linear mode 8% of the time, and the envelope tracking mode is represented by a line 56 associated with the amplifier system being in the envelope tracking mode 91% of the time. It is to be appreciated that the graph 50 is for illustrative purposes, and the percentage of time that the amplifier system operates in the respective nodes depends on the desired amplifier system efficiency, power requirements, bandwidth and acceptable OOB emissions.

An example system would have 0.55% efficiency in the polar mode (1% of the time), 40% in the ET mode (75% of time), and 20% in the linear mode. The composite efficiency would be close to 40%. An ET system that maintains 3 dB headroom would have efficiency in the same range but would use an amplifier twice as large. The polar mode uses the same configuration as the ET amplifier adding a mode of operation. The limited range of signals in the polar mode allow it to operate with a high efficiency, low bandwidth AM path sized for the ET mode.

For example, if the amplified output signal has a peak voltage of 25 volts, the first threshold level $T_L$ associated with the amplified input signal can be selected to be about 3 volts and the second threshold level $T_P$ associated with the amplified input signal can be selected to about 22 volts. The voltage supply headroom can be selected to about 3 volts. The amplifier system then would operate in the envelope tracking mode for envelope amplitude output levels from about 3 volts to about 22 volts, in a linear mode for envelope amplitude output levels below about 3 volts and in a polar mode for envelope amplitude output levels from about 22 volts to about 25 volts. It is to be appreciated that the actual threshold levels would be the pre-amplified version of the first and second threshold levels, and the actual comparison would be to the input signal amplitude levels.

The supply signal to the power amplifier in the linear mode can be set to a constant voltage, such that the supply level never falls below, for example, 3–6 volts. The supply signal in the envelope tracking mode will vary from about 6 to about 25 volts for envelope amplitude levels from about 3 volts to about 22 volts, such that a 3 volt supply voltage head room is maintained. Once the output signal level exceeds 22 volts, the amplifier system will operate in the polar mode, such that the supply signal to the amplifier does not exceed the peak voltage of the output signal. In a conventional envelope tracking amplifier, the supply signal voltage at a peak voltage of 25 volts with a supply voltage head room of 3 volts would require a 28 volt supply signal. In conventional applications, the above peak voltage supply voltage requires an additional power supply and a larger power amplifier.

Figure 4:
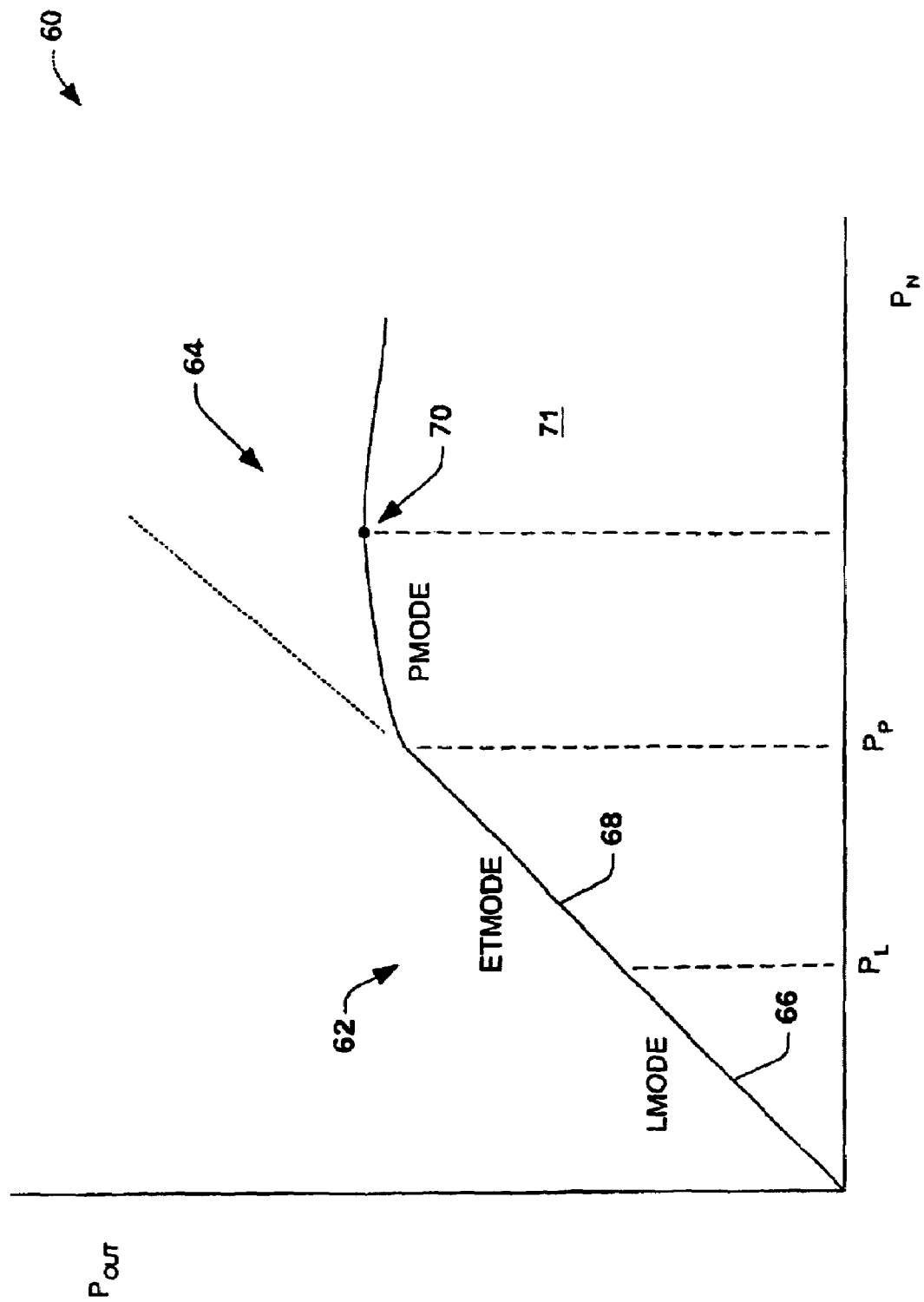
FIG. 4 illustrates a graph of power out ($P_{OUT}$) versus power in ($P_{IN}$) of a power amplifier in accordance with an aspect of the present invention.

FIG. 4 illustrates a graph 60 of power out ($P_{OUT}$) versus power in ($P_{IN}$) of a power amplifier for a constant supply level. As illustrated in the graph 60, the power amplifier has a linear operation region 62 and a gain compression region 64. The end point of the compression region is a saturation point 70. Increasing the input signal beyond saturation 71 generally results in reduction of operating output power, as illustrated in FIG. 4. The linear operation region 62 and the gain compression region 64 are determined based on the characteristics of the power amplifier at each selected supply or drain voltage. As the supply voltage is reduced, the input voltage at which gain compression occurs is reduced proportionally. A first threshold power level $P_L$ is selected that corresponds to a constant supply that ensures that the amplifier operates in the linear mode (LMODE), for the lowest level input signals, along a lower portion 66 of the linear operation region 62 of the power amplifier.

For signals above power level $P_L$ and below a second threshold power level $P_P$ the amplifier operates in envelope tracking mode (ETMODE), along a higher portion 68. In this mode the supply voltage maintains headroom so the amplifier doesn't enter the compression region 64. The second threshold power level $P_P$ is also selected so that input signals larger than this are converted to polar mode. The AM component modulates the supply voltage while the amplifier operates at or near the saturation point 70 (PMODE) with the constant envelope input signal. The power amplifier size, the first threshold power level $P_L$ and the second threshold power level $P_P$ can be selected to provide a desired efficiency, linearity, bandwidth and acceptable OOB emissions of the power amplifier system.

The amplifier system of the present invention minimizes the complexity of the circuitry necessary to amplify a given input signal by performing many of the functions that create variables in the amplifier system in the digital domain. This also facilitates amplitude and phase modulation synchronization in the polar mode and efficient generation of a supply signal in the envelope tracking mode since many of the delays associated with convention polar and envelope tracking amplifiers are mitigated. Additionally, the operation of the amplifier system can be further improved by employing linearization techniques in the digital domain.

Figure 5:
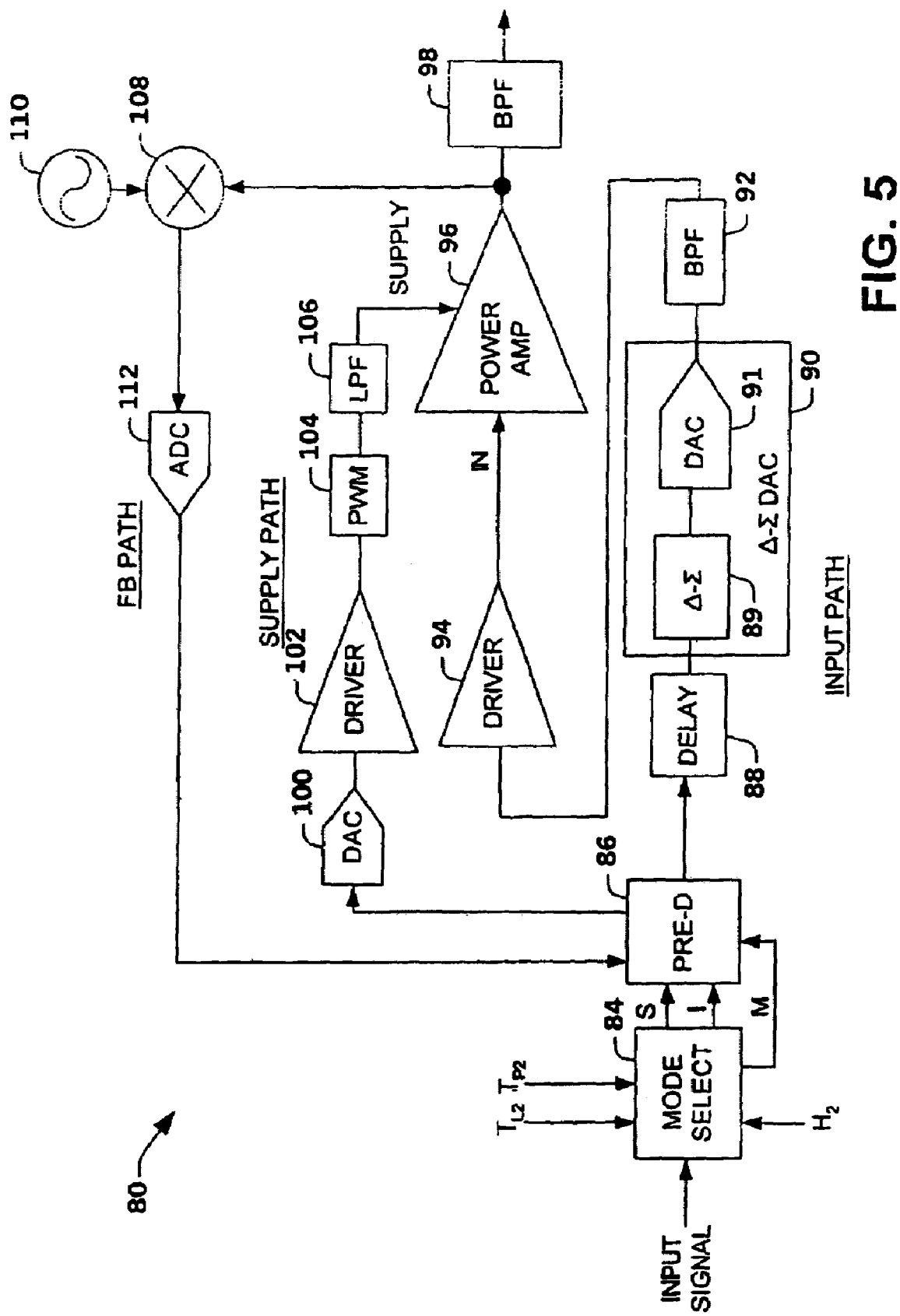
FIG. 5 illustrates a schematic block diagram of an amplifier system employing pre-distortion linearization techniques in accordance with an aspect of the present invention.

FIG. 5 illustrates an amplifier system 80 employing pre-distortion linearization techniques in accordance with an aspect of the present invention. Pre-distortion modifies the signals to reduce distortion in the amplifier chain as well as in the composite output signal. Determination of the desired pre-distortion is typically performed off-line. Pre-distortion can be performed on the amplifier input signal and the amplifier supply signal in the digital domain, such that the digital input and supply signals are modified prior to digital-to-analog conversion.

The amplifier system 80 includes a mode selector 84 that determines the operating mode (envelope tracking mode, linear mode, polar mode) of the amplifier system 80 by transmitting an amplifier input signal through an input line (I) to a predistortion component 86, and an amplifier supply signal through a supply line (B) to the predistortion component 86.

In the envelope tracking mode, the mode selector 84 transmits a composite input signal through the input lines (I) and an envelope tracking supply signal that is approximately equal to the amplitude modulated component plus a headroom amplitude ($H_2$) through the supply line (S). In the linear mode, the mode selector 84 transmits a composite input signal through the input line (I) and a substantially constant amplitude supply signal through the supply line (B). In the polar mode, the mode selector 84 transmits a phase modulated component of the composite input signal through the input line (I) and an amplitude modulated component of the composite signal through the supply line (B). The mode selector 84 determines the mode of the amplifier system based on a characteristic of the input signal, such as envelope amplitude, with respect to a first threshold level $T_{L2}$ and a second threshold level $T_{P2}$. The mode selector 84 also provides the, predistortion component 86 with mode information through a mode line (M).

The predistortion component 86 employs the mode information to determine the desired predistortion to add to or remove from the amplifier input signal and/or the supply signal. For example, different predistortion is added or removed from the composite signal, the phase modulated component and the amplitude modulated component. The predistortion component 86 can also add or remove predistortion from the supply signal. It is to be appreciated that the predistortion component 86, and the mode selector 84 can be one or more digital hardware components and/or software algorithms.

The predistortion component 86 has a first output coupled to a digital-to-analog converter (DAC) 100 that converts the supply signal to an analog signal along a supply path. A driver 102 is provided to buffer and add gain to the analog supply signal, which is then provided to a pulse width modulator 104. The pulse width modulator 104 cooperates with a low pass filter 106 to provide a Class-S type or Class-G type of amplifier/modulator. The pulses of the pulse width modulator 104 are integrated via the low pass filter 106 to provide an output that is a function of the width of the pulses from the pulse width modulator 104. The output of the low pass filter 106 is coupled to the supply terminal of the power amplifier 96.

The predistortion component 86 has a second output coupled to a delta-sigma DAC 90 through a delay component 88 along an input path. The delay component 88, is easily implemented with digital logic, which facilitates synchronization of the power amplifier input signal and supply signal, for example, during mode transitions and amplifier system operation. The delta sigma DAC 90 includes a delta sigma modulator 89 coupled to a DAC 91. The DAC 91 can be a multi-bit DAC or a single-bit DAC. The output of the delta sigma DAC is coupled to a band pass filter 92. The delta-sigma modulator 89 performs a digital-to-digital conversion or quantization of the input signal to provide a signal of lower resolution at a higher frequency. The DAC 91 then converts the quantized signal from the digital domain to the analog domain. The band pass filter 92 filters out noise associated with the quantization of the input signal.

The delta sigma DAC 90 can be employed to upmix or convert the signal to radio transmission frequencies, so that the need for analog or digital mixers is not required. The output of the band pass filter 92 is then provided to a driver 94, which provides some additional gain to the input signal. The output of the driver 94 is then provided to the input terminal of the power amplifier 96 for amplification. The power amplifier 96 can be a linear amplifier (e.g., Class-A, Class-AB, Class-B) based on desired performance, acceptable efficiency and acceptable OOB emissions.

The amplifier system 80 includes an optional feedback (FB) path from the output signal to the predistortion component 86 to compensate for variations in the system. The optional feedback path includes an optional mixer 108 and an optional local oscillator 110. The output signal is down-converted and digitized using a high dynamic range, highly linear ADC 112. The digitized values are compared to the expected signal parameters. Differences in measured and expected values are used to adapt the values used by the pre-distortion component 86. The adaptation is substantially slower than the signal and is primarily to account for temperature and aging changes in the system 80.

It is to be appreciated that optional taps (not shown) can be provided at the gate and drain inputs of the power amplifier 96 to calibrate and synchronize their relative delay. Additionally, an optional feedback path (not shown) from the output of the amplifier 96 can be provided for the supply path. In the optional feedback path, the output of the power amplifier would be passed through an analog envelope detector and sent to a small error amplifier after the DAC 100 in the supply path to remove errors in the supply signal. An optional filter (not shown) can be provided on the output of the supply path DAC 100 which may be required depending on the type of DAC (e.g., delta sigma DAC) utilized.

In the envelope tracking mode, the predistortion component 86 transmits the predistorted composite input signal through the input path and the predistorted amplitude modulated component of the composite signal plus the variable headroom voltage ($H_2$) through the supply path. In the linear mode, the predistortion component 86 transmits the predistorted composite signal through the input path and the constant amplitude supply signal through the supply path. In the polar mode, the predistortion component 86 transmits the predistorted phase modulated component of the composite signal through the input path and the predistorted amplitude modulated component through the supply path. The amplifier input signal and supply signal are provided by the predistortion component 86 in digital form and converted to analog form to the input terminal and supply terminal, respectively, of the power amplifier 96. The output of the power amplifier 96 is then filtered by an optional band pass filter 98, such that amplified filtered output signal can be transmitted wireless or wired over a communication link.

Figure 6:
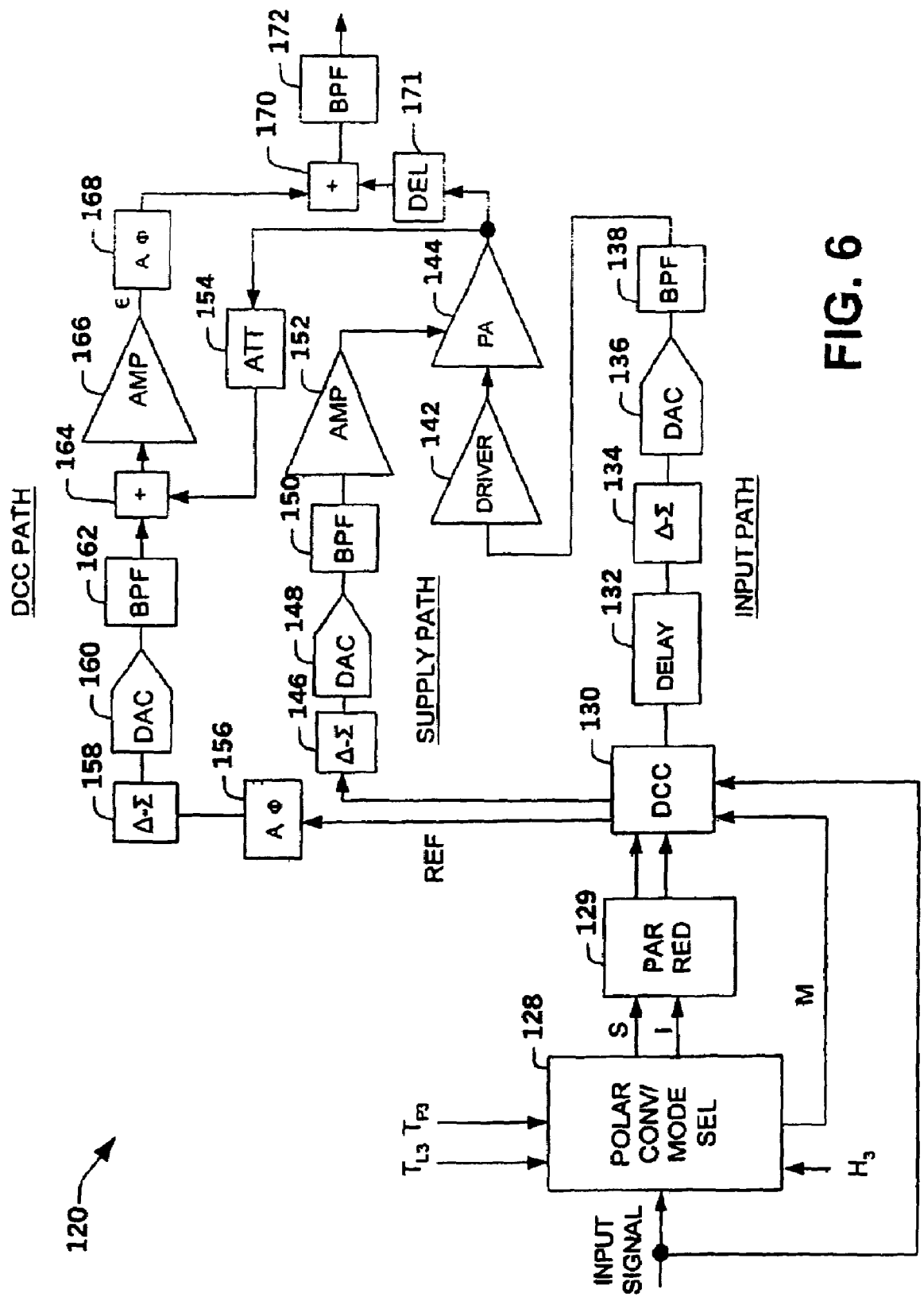
FIG. 6 illustrates a schematic block diagram of an amplifier-system employing an alternate linearization technique in accordance with an aspect of the present invention.

FIG. 6 illustrates an amplifier system 120 employing an alternate linearization technique in accordance with an aspect of the present invention. The alternate technique is referred to as digital cross-cancellation and can be implemented alone or combined with the predistortion technique illustrated in FIG. 5. The digital cross-cancellation technique provides a digital reference of the wanted signal to a separate DAC generating a "clean" version of the wanted signal. The clean version of the wanted signal is phase inverted and combined with a portion of the output signal from a power amplifier to determine the error or unwanted portion of the output signal. The unwanted portion of the input signal is distortion and undesirable OOB emissions. The unwanted portion of the input signal is then inverted and combined with the output signal to cancel the unwanted portion from the output signal. Typically, an amplifier system that separates a signal into components (e.g., polar amplifier) does not have a single reference signal available. However, the present invention provides for generation of a clean reference signal or an inverted version of a clean reference signal in the digital domain.

The digital cross-cancellation technique of the present invention provides for post correction and signal cancellation of signals purposefully removed and/or added to the input signal to achieve desired operation of the amplifier system 120. For example, signals can be added to reduce overall peak levels, and the digital cross-cancellation technique can remove these added signals prior to transmission of the output signal. Therefore, smaller (lower peak power) and less costly power amplifiers can be employed to achieve similar performance and improved amplifier system efficiency as compared to amplifier systems with much larger less efficient power amplifiers.

A mode selector 128 receives an input signal, for example, having amplitude and phase modulation. The mode selector 128 determines the operating mode (envelope tracking mode, linear mode, polar mode) of the amplifier system 120 based on a first threshold level $T_{L3}$ and a second threshold level $T_{P3}$. The mode selector 128 determines the operating mode (envelope tracking mode, linear mode, polar mode) of the amplifier system 120 by transmitting an amplifier input signal through an input line (I) to a PAR reduction component 129, and an amplifier supply signal through a supply line (S) to the PAR reduction component 129.

In the envelope tracking mode, the mode selector 128 transmits a composite input signal through the input line (I) and an envelope tracking supply signal that maintains a variable headroom amplitude ($H_3$) through the supply line (S). In the linear mode, the mode selector 128 transmits a composite input signal through the input line (I) and a substantially constant amplitude supply signal through the supply line (S). In the polar mode, the mode selector 128 transmits a phase modulated component of the composite input signal through the input line (I) and an amplitude modulated component of the composite signal through the supply line (S). The mode selector 128 determines the mode of the amplifier system based on a characteristic of the input signal, such as envelope amplitude, with respect to the first threshold level $T_{L3}$ and the second threshold level $T_{P3}$.

The PAR reduction component 129 can reduce peak signal levels through clipping or include the addition of signals as well as pre-distortion of the composite signal and/or amplitude and phase terms to counter expected distortion. The PAR reduction component 129 then passes the selected signals to a digital cross-cancellation component 130.

The digital cross-cancellation component 130 generates a first digital output signal along an input path and a second digital output signal along a supply path. The first digital output is one of the composite signal in the linear mode and envelope tracking mode and a constant envelope phase modulated component of the composite signal in the polar mode. The second digital output is one of a substantially constant amplitude signal in the linear mode, an amplitude modulated component and a head room voltage ($H_3$) in the envelope tracking mode and an amplitude modulated component in the polar mode. The digital cross-cancellation component 130 can add or remove signals to the first and second digital outputs to improve the performance of the amplifier system 120.

The digital cross-cancellation component 130 also receives the original input signal prior to PAR reduction and generates a third digital output signal that is a clean reference signal (REF) proportional to the desired output prior to any modification of the first digital output signal and the second digital output signal. It is to be appreciated that clean reference signal can be a representation of the desired output signal or an inverted representation of the desired output signal.

The first digital output signal is transmitted to a delta-sigma modulator 134 through a delay component 132. The delay component 132 facilitates synchronization of the phase modulated component and amplitude modulated component during polar mode operation, the envelope tracking supply signal during the envelope tracking mode, signal synchronization during mode transitions, and facilitates cross-cancellation of the final output signal. The delta sigma modulator 134 is coupled to a 1-bit DAC 136 and a band pass filter 138. The delta-sigma modulator 134, the 1-bit DAC 136 and the band pass filter 138 cooperate to perform a digital-to-analog conversion directly to radio transmission frequencies. The output of the band pass filter 138 is then provided to a pair of drivers 140 and 142, which provides some additional gain to the analog input signal. The output of the driver 142 is then provided to the input terminal of the power amplifier 144 for amplification. The power amplifier 144 can be a linear amplifier (e.g., Class-A, Class-AB, Class-B) desired performance, acceptable efficiency and acceptable OOB emissions. The Delta-sigma DAC can be replaced by a conventional multi-bit DAC if the DAC linearity can enables sufficiently low distortion for it to generate the error signal.

The second digital output is transmitted to a delta-sigma modulator 146: The delta sigma modulator 146 is coupled to a 1-bit DAC 148 and a band pass filter 150. The delta-sigma modulator 146, the 1-bit DAC 148 and the band pass filter 150 cooperate to perform a digital-to-analog conversion directly to radio transmission frequencies. The output of the band pass filter is then provided to a modulation amplifier 152 (e.g., Class-S, Class-G). The output of the modulation amplifier 152 is coupled to the supply terminal of the power amplifier 144 to provide the desired amplitude modulation in the polar mode and envelope tracking mode and substantially constant supply voltage in the linear mode.

The digital cross-cancellation component 130 provides the third digital signal along a DCC path to a digital inverter 156. The third digital signal is a clean reference version (REF) of the input signal corresponding to the desired amplified output signal prior to any modifications. Alternatively, the digital inverter 156 can be eliminated and the inverted version of the clean reference signal can be provided by the digital cross-cancellation component 130. The inverted clean reference signal is transmitted to a delta-sigma modulator 158. The delta sigma modulator 158 is coupled to a 1-bit DAC 160 and a band pass filter 162. The delta-sigma modulator 158, the 1-bit DAC 160 and the band pass filter 162 cooperate to perform a digital-to-analog conversion directly to radio transmission frequencies of the inverted version of the clean reference signal (REF). If a higher frequency is needed a mixer and local oscillator can be optionally inserted to provide frequency conversion.

A small portion of the power amplifier output is split off by a coupler through an attenuator 154 and summed with the inverted clean reference signal through a summer 164. The output of the summer 164 is signal distortion and OOB emissions. The output of the summer 164 is amplified by an error amplifier 166 to produce an error signal ($\epsilon$). The error signal is inverted through an inverter 168 to provide an inverted error signal. The output of the main amplifier is delayed through delay element 174 [add to graphic] which may be a transmission line for example. The inverted error signal is recombined with a delayed version of the output of the power amplifier 144 via a delay component 171 through a summer 170 to remove OOB emissions and reduce distortion levels. The output of the summer 170 is then provided to an optional band pass filter 172 which filters out any remaining unwanted signals outside the desired transmission band.

The digital cross-cancellation technique in accordance with an aspect of the present invention can supply correction for amplifier distortions and it can correct spectral leakage (a form of OOB emissions) that occurs from intentional clipping of the wanted signals performed to allow for amplifier size reduction (e.g., amplifiers in the input and supply paths are sized to according to the peak signals). Additionally, since an unclipped digital reference signal is employed to determine the desired correction at the output, any modification of the signal can be corrected at the final output stage without the need for additional correction information during the amplification process.

Figure 7:
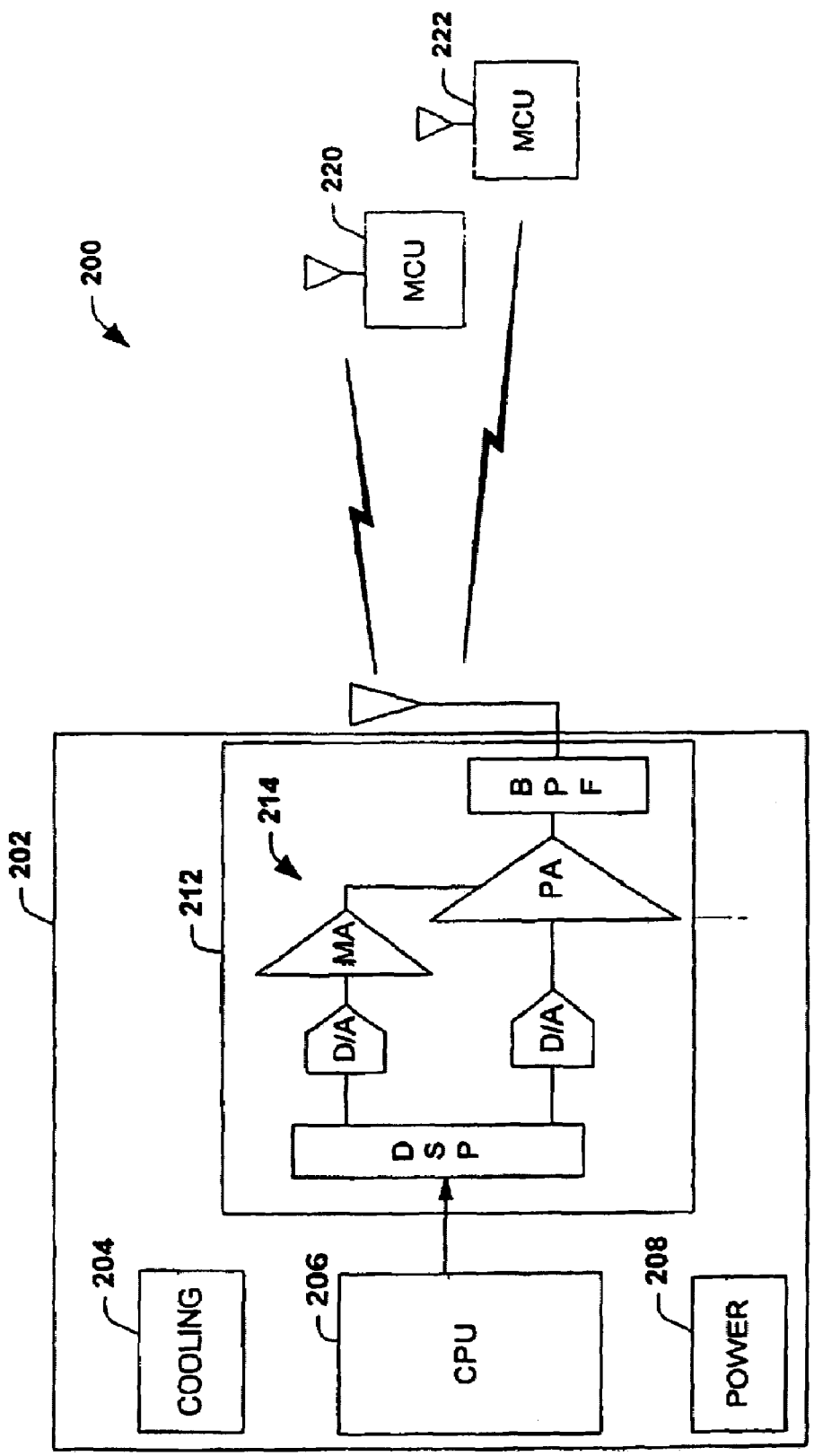
FIG. 7 illustrates a block diagram of a communication system in accordance with an aspect of the present invention.

The amplifier system of the present invention can be employed in a number of applications. The amplifier system can be employed in wireless transmitter applications for base stations (e.g., satellites, cellular), handsets, and other mobile communication devices. FIG. 7 illustrates a communication system 200 having a base station 202 with a transmitter 212 employing an amplifier system 214 (multimode, polar/envelope tracking/linear operation) in accordance with an aspect of the present invention. The amplifier system 214 that employs a DSP to operate the amplifier system 214 in a linear mode when envelope input signals are about below a first threshold level, an envelope tracking mode when envelope input signals are about between the first threshold level and a second threshold level and in a polar mode when envelope signals are about above the second threshold level.

A central processing unit (CPU) 206 is coupled to the DSP of the amplifier 214. The CPU 206 can facilitate control and threshold selection of the amplifier system 214. For example, the CPU 206 can generate the type of signal (e.g., WCDMA, GSM, OFDM) to be transmitted and select the threshold levels in which the amplifier switches between envelope tracking mode, the polar mode and the linear mode. The base station 202 communicates to a group of mobile communication unit (MCUs) comprised of MCUs 220 and 222. The MCUs 220 and 222 are for illustrative purposes and it should be appreciated that the group of MCUs can include a greater number of MCUs based on the number of carriers in the output signal.

The base station 202 also includes cooling devices 204 and power devices 208. The power devices 208 can include AC-DC conversion components and battery backup devices that protect the base station 202 from power loss failures. The power devices 208 and cooling devices 204 can be substantially reduced in size and cost compared to conventional devices, since the amplifier system of the present invention operates with substantially smaller amplifiers than conventional envelope tracking amplifiers and with substantially better efficiency than conventional linear amplifier systems. Although the base station 202 is illustrated as having a single transmitter 212, the base station 202 can have a plurality of transmitters communicating to different respective groups of MCUs over similar communication signal standards or different communication signal standards. Additionally, the MCUs 220 and 222 can also include transmitters with amplifier systems that operate in an envelope tracking mode, a linear mode and a polar mode similar to that described for the transmitter 212.

Figure 8:
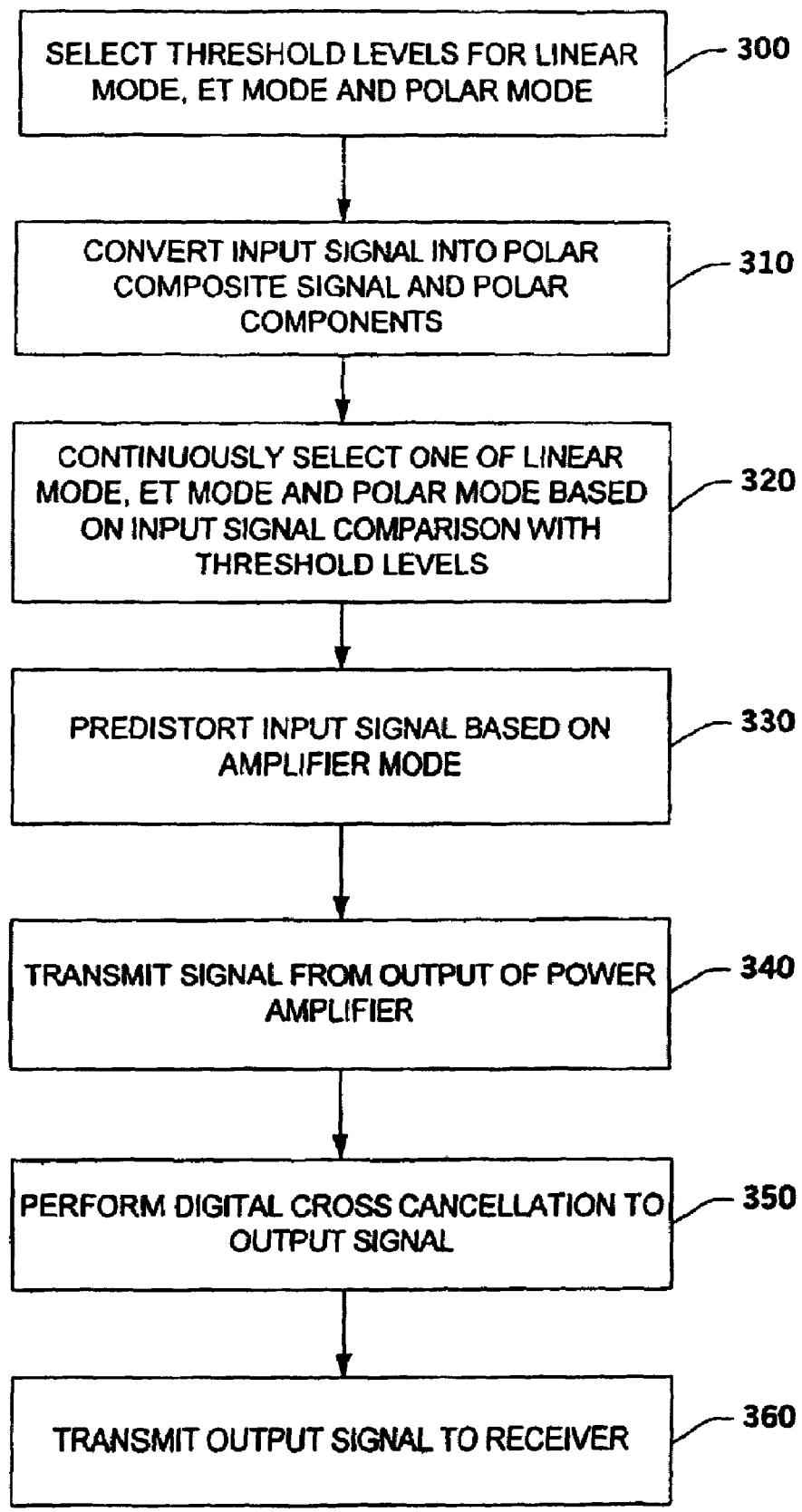
FIG. 8 illustrates a methodology for operating an amplifier system in accordance with an aspect of the present invention.

In view of the foregoing structural and functional features described above, a methodology in accordance with various aspects of the present invention will be better appreciated with reference to FIG. 8. While, for purposes of simplicity of explanation, the methodology of FIG. 8 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect the present invention.

FIG. 8 illustrates a methodology for operating an amplifier system having a power amplifier with a supply terminal and an input terminal in accordance with an aspect of the present invention. The methodology begins at 300 where a first and a second threshold level are selected for switching between an envelope tracking mode, a linear mode and a polar mode. The threshold levels can be, for example, envelope amplitude levels in which the amplifier system operates in a polar mode for peak level envelope amplitude signals, a linear mode at low level signals and in an envelope tracking mode for intermediate level signals. At 310, the in put signal is converted into a polar composite signal, and amplitude and phase modulated components of the polar composite signal. The input signal can be in a number of different single carrier or multi-carrier amplitude and phase modulated signal formats (e.g., WCDMA, GSM, OFDM). At 320, the amplifier system continuously selects operation between the linear mode, the envelope tracking mode and the polar mode based on a comparison of the input signal to the first and second threshold levels.

For example, the first and second threshold levels can be a signal amplitude level associated with the input signal. The linear mode is selected for envelope amplitudes of the input signal level below about the first threshold level, and the polar mode is selected for envelope amplitude levels above about the second threshold level. The envelope tracking mode is selected for envelope amplitudes of the input signal between about the first threshold level and the second threshold level. It is to be appreciated that other signal characteristics can be employed to determine at which portion of the input signal that the amplifier system operates in a polar mode, an envelope tracking mode or a linear mode.

During the envelope tracking mode, an envelope tracking signal comprised of an amplitude modulated component of the composite signal plus a headroom voltage is transmitted to the supply terminal of the power amplifier, and a composite input signal is transmitted to the input of the power amplifier. During the linear mode, a substantially constant voltage amplitude signal is transmitted to the supply terminal of the power amplifier, and the composite input signal is transmitted to the input of the power amplifier. During the polar mode, an amplitude modulated component of the composite input signal is transmitted to the supply terminal of the power amplifier, and a constant envelope phase modulated component is transmitted to the input of the power amplifier. The power amplifier input signal and the power amplifier supply signal can be transmitted in digital format, and converted into the analog domain via respective DACs (e.g., delta-sigma modulated DACs). The amplifier supply signal is then amplified, for example, employing a Class-S or Class-G amplifier/modulator, prior to being provided to the supply terminal of the power amplifier.

At 330, the power amplifier supply signal and the power amplifier input signal are predistorted based on the amplifier mode. Predistortion scales amplitude or phase of the input signal and/or the supply signal to counter anticipated unwanted distortion. The signal is then transmitted to the output of the power amplifier at 340.

At 350, digital cross-cancellation is performed on the output of the power amplifier. The digital cross-cancellation technique provides a digital reference of the wanted signal to a separate DAC generating a "clean" version of the wanted signal. The clean version of the wanted signal is inverted and combined with the actual output-signal from the power amplifier to determine the unwanted portion of the output signal. The unwanted portion of the input signal is then inverted and combined with a delayed version of the output of the power amplifier to cancel the unwanted portion from the output signal. At 360, the predistorted, digitally cross-cancelled recombined signal is transmitted to one or more destination receivers.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. An amplifier system comprising:
   a power amplifier operative to amplify an input signal, the power amplifier having an input terminal and a supply terminal, the power amplifier being a linear class type amplifier that operates as a constant class amplifier; and
   a mode selector that controls the operation of the amplifier system between an envelope tracking mode, a polar mode and a linear mode by providing a selected amplifier input to the input terminal and a selected amplifier supply signal to the supply terminal based on a characteristic of the input signal.

2. The system of claim 1, the amplifier system operates in the linear mode for low level signals, the polar mode for peak level signals, and in the envelope tracking mode for signals between low level signals and peak level signals, the peak level signals being signals that have an amplitude equal to or greater than a threshold level substantially equal to a headroom voltage below a peak voltage of the input signal, the headroom voltage being associated with the envelope tracking mode.

3. The system of claim 1, the mode selector provides:
   a composite signal component to the input terminal and a substantially constant envelope signal component to the supply terminal during linear mode operation;
   a composite signal component to the input terminal and a variable amplitude signal to the supply terminal during the envelope tracking mode operation; and
   a phase modulated signal component of the input signal to the input terminal and an amplitude modulated signal component of the input signal to the supply terminal during polar mode operation.

4. The system of claim 1, the mode selector having a first output coupled to the input terminal through a first digital-to-analog converter (DAC) and a second output coupled to the supply terminal through a second DAC and a modulation amplifier, the mode selector transmits digital representations of an amplifier input terminal signal and an amplifier supply terminal signal to the first and second DACs, respectively, which convert the digital representations into analog signals.

5. The system of claim 4, at least one of the first and second DACs comprising a delta-sigma DAC, such that the digital representations of at least one of the amplifier input signal component and the supply signal component are converted into the analog domain directly at a desired radio transmission frequency.

6. The system of claim 1, further comprising a predistortion component that modifies at least one of a signal to the input terminal and the supply terminal in the digital domain to mitigate output distortion of the power amplifier.

7. The system of claim 1, further comprising a digital cross-cancellation component that generates a reference signal corresponding to a desired output signal of the amplifier system, the reference signal being combined with a portion of an output signal from the power amplifier to determine an error signal, the error signal being inverted and combined with a delayed version of the output signal of the power amplifier to generate a final output signal.

8. The system of claim 7, the reference signal being provided to a delta sigma digital-to-analog converter (DAC) to convert the reference signal from the digital domain to the analog domain directly to a desired radio transmission frequency.

9. The system of claim 7, further comprising a peak-to-average reduction (PAR) component that clips and/or removes peaks signals from the input signal, the digital cross-cancellation component providing corrective signals to the final output signal.

10. The system of claim 1, further comprising a feedback path to compensate for variations in age and temperature of the amplifier system.

11. A transmitter comprising the amplifier system of claim 1.

12. A base station comprising the transmitter of claim 11.

13. The system of claim 1, the mode selector operative to delay the amplifier input and the supply signal in the envelope tracking mode to generate a supply signal with an acceptable headroom.

14. An amplifier system comprising:
   a power amplifier;
   a modulation amplifier having an output coupled to a supply terminal of the power amplifier;
   a first digital-to-analog converter (DAC) coupled to an input terminal of the power amplifier;
   a second DAC coupled to an input terminal of the modulation amplifier; and
   a digital system having a first output coupled to an input of the first DAC and a second output coupled to the input of the second DAC, the digital system controls the operation of the amplifier system between an envelope tracking mode, a polar mode and a linear mode based on an amplitude level of an input signal, the amplifier system operates in the linear mode for low amplitude level input signals below about a first threshold level, the polar mode for peak level input signals above about a second threshold level, and in the envelope tracking mode for signals between about the first threshold level and the second threshold level, the second threshold level having an amplitude substantially equal to a headroom voltage below a peak voltage of the input signal, the headroom voltage being associated with the envelope tracking mode.

15. The system of claim 14, the digital system provides:
   a composite component of the input signal to the input terminal of the power amplifier and a substantially constant amplitude signal to the supply terminal of the power amplifier during the linear mode;
   a phase modulated component of an input signal to the input terminal of the power amplifier and an amplitude modulated component of the input signal to the supply terminal during the polar mode; and
   a composite component of the input signal to the input terminal of the power amplifier and a variable amplitude signal to the supply terminal of the power amplifier during the envelope tracking mode.

16. The system of claim 15, the variable amplitude signal to the supply terminal during the envelope tracking mode operation being an amplitude modulated component of the input signal plus a headroom amplitude that is a function of one of time and input power.

17. The system of claim 15, at least one of the first and second DACs converting digital signals into the analog domain directly at a desired radio transmission frequency.

18. The system of claim 15, further comprising at least one of a predistortion component that modifies signals provided to the power amplifier to mitigate output distortion of the power amplifier, and a digital cross-cancellation component that generates a reference signal corresponding to a desired output signal of the amplifier system, the reference signal being combined with a portion of an output signal from the power amplifier to determine an error signal, the error signal being inverted and combined with a delayed version of the output signal of the power amplifier to generate a final output signal.

19. An amplifier system comprising:
   means for amplifying a phase and/or amplitude modulated input signal; and
   means for switching modes of operation of the amplifier system between an envelope tracking mode, a polar mode and a linear mode based on an amplitude level of the input signal relative to a first threshold level and a second threshold level, the amplifier system operates in the linear mode for input signal amplitudes below about the first threshold level, the polar mode for input signal amplitudes above about the second threshold level, and in the envelope tracking mode for input signal amplitudes between about the first threshold level and about the second threshold level, the second threshold level having an amplitude substantially equal to a headroom voltage below a peak voltage of the input signal, the headroom voltage being associated with the envelope tracking mode.

20. The system of claim 19, further comprising means for converting the input signal into a polar representation of the input signal, the polar representation comprising a composite signal component having an amplitude modulated component and a phase modulated component, the amplitude modulated component supplying the means for amplifying and the phase modulated component being amplified by the means for amplifying during the polar mode, the means for amplifying being supplied by a constant amplitude signal and the composite signal component being amplified by the means for amplifying in the linear mode, and the means for amplifying being supplied by a variable amplitude voltage above the amplitude modulated component and the composite signal be amplified by the means for amplifying in the envelope tracking mode.

21. The system of claim 19, further comprising means for converting at least a portion of the input signal from the digital domain to the analog domain directly to a desired radio transmission frequency.

22. The system of claim 19, further comprising means for modifying the input signal and means for modifying the output signal to facilitate amplifier system efficiency and mitigate out-of-band emissions.

23. A method of amplifying an input signal with a power amplifier, the method comprising:
   switching modes of operation of the power amplifier between envelope tracking mode, polar mode and linear mode based on a characteristic of the input signal relative to a first threshold level and a second threshold level;
   transmitting a composite signal to the input terminal and a variable amplitude signal with a headroom amplitude that ensures the amplifier is not significantly in the gain compression region during envelope tracking mode operation, transmitting a phase modulated component of the input signal to an input terminal of a power amplifier and an amplitude modulated component of the input signal to a supply terminal of the power amplifier during polar mode operation, and transmitting a composite signal to the input terminal and a constant amplitude component to the supply terminal during linear mode operation, the second threshold level being substantially equal to the headroom amplitude below a peak voltage of the input signal; and
   amplifying the input signal via the power amplifier.

24. The method of claim 23, further comprising transmitting the amplified input signal to at least one receiver.

25. The method of claim 23, further comprising converting at least a portion of the input signal from the digital domain to the analog domain directly to a desired radio transmission frequency prior to providing at least a portion of the input signal to the power amplifier.

26. The method of claim 23, further comprising at least one of modifying the input signal and modifying the output signal to facilitate the efficiency and mitigate out-of-band (OOB) emissions of the power amplifier.

27. The method of claim 23, the first threshold level being an envelope amplitude level that corresponds to low level amplifier signals and the second threshold being an envelope amplitude level that corresponds to peak level amplifier signals.

28. An amplifier system comprising:
   a power amplifier operative to amplify an input signal, the power amplifier having an input terminal and a supply terminal;
   a mode selector that controls the operation of the amplifier system between an envelope tracking mode, a polar mode and a linear mode by providing a selected amplifier input to the input terminal and a selected amplifier supply signal to the supply terminal based on a characteristic of the input signal; and
   a digital cross-cancellation component that generates a reference signal corresponding to a desired output signal of the amplifier system, the reference signal being combined with a portion of an output signal from the power amplifier to determine an error signal, the error signal being inverted and combined with a delayed version of the output signal of the power amplifier to generate a final output signal.

* * * * *